United States Patent [19]

Jensen et al.

[11] Patent Number: 4,928,315

[45] Date of Patent: May 22, 1990

[54] CHIRPED BACKSCATTER FILTER

[75] Inventors: Preben B. Jensen, Rancho Palos Verdes; Edward L. Arnn, Torrance, both of Calif.

[73] Assignee: Hughes Aircraft Company, Los Angeles, Calif.

[21] Appl. No.: 136,063

[22] Filed: Dec. 21, 1987

[51] Int. Cl.$^5$ .......................... H04B 1/10; H04B 1/12
[52] U.S. Cl. ............................ 455/307; 455/303; 455/305; 455/296; 328/167; 307/526; 307/520
[58] Field of Search .............. 455/307, 296, 303, 305, 455/310; 328/165, 167; 307/520, 521, 526; 342/101

[56] References Cited

U.S. PATENT DOCUMENTS

| | | | |
|---|---|---|---|
| 3,744,015 | 7/1973 | Marimon et al. | 455/307 |
| 4,067,013 | 1/1978 | Smith | 455/307 |
| 4,177,430 | 12/1979 | Paul | 455/307 |
| 4,569,072 | 2/1986 | Van Roermund | 455/307 |
| 4,731,587 | 3/1988 | Jensen | 328/167 |

Primary Examiner—Benedict V. Safourek
Assistant Examiner—Ralph Smith
Attorney, Agent, or Firm—William J. Streeeter; Wanda K. Denson-Low

[57] ABSTRACT

A chirped backscatter filter 10 compares a received signal (RSIG) to a reference signal related to a transmitted signal (TSIG) and removes from RSIG the frequency component which is equal to TSIG in frequency. This removed frequency component corresponds to the frequency of the transmitter backscatter radiation. The filter of the invention adds a frequency offset ($f_n$) to both RSIG and TSIG in mixers 12 and 14 before substracting one from the other in mixer 22. Thus, equal frequency components in both RSIG and TSIG, such as the backscatter radiation frequency component of RSIG, will equal $f_n$. The frequencies resulting from this subtraction are thereafter passed through a notch filter 24 which is centered on $f_n$ and which passes all frequency components except $f_n$. The output of the notch filter thus no longer has a frequency component associated with the backscatter frequency component. The loss of the RSIG phase reference due to the phase reference between the RSIG and TSIG modulation envelopes being destroyed during the backscatter filtering process is therafter compensated for by adding TSIG to the filtered difference frequency component, thereby reestablishing the phase relationship of the original RSIG frequency components minus the backscatter frequency component.

19 Claims, 3 Drawing Sheets

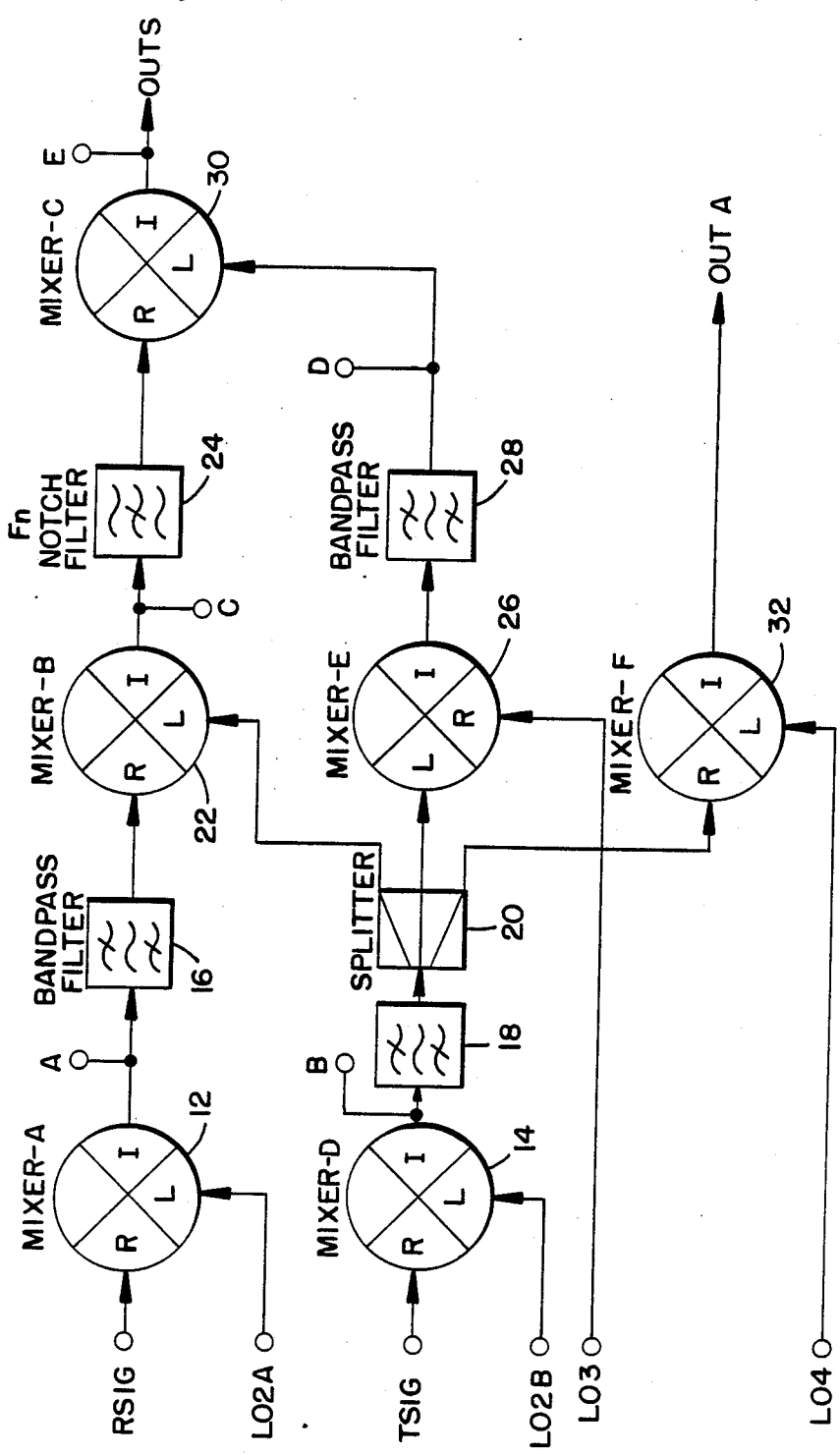
FIG. I.

CHIRPED BACKSCATTER FILTER

FIELD OF THE INVENTION

The present invention relates to a frequency filter and, in particular, relates to a filter having frequency mixers, bandpass filters and a fixed frequency "notch" filter which is used to reject an interference signal which has a time-varying frequency component.

BACKGROUND OF THE INVENTION

Single aperture laser radars and related systems often comprise fast optical scanners and chirp modulators. These fast optical scanners in conjunction with optical signal path length differences introduce, due to Doppler shift effects, instantaneous frequency deviations between a transmitted frequency and a received transmitter backscatter frequency. This frequency deviation causes a significant problem when it is desired to filter out, or reject, the backscattered frequency component. An inability to effectively reject the backscattered frequency component may result in, for example, severe range masking effects in a continuously transmitting and receiving laser radar system.

It has been known to employ a complex-vector modulator (CVM) type filter to reduce the backscattered frequency component, such as one disclosed in copending application Ser. No. 06/807,391 (now U.S. Pat. No. 4,731,587 issued Mar. 15, 1988). While providing beneficial filtering results in many applications, in some applications the CVM filter may not be adequate.

For example, the bandwidth of the CVM filter may be inadequate to reject rapidly time-varying frequency shifts induced by fast optical scanning devices in the signal path. Also, the maximum dynamic range of the CVM filter is typically limited to 30-40 dB due to "feedthrough" limitations. Furthermore, the CVM filter is essentially an active, as opposed to a passive, filter and comprises dual feedback paths, making the filter sensitive to level variations in a reference Transmitter Signal (TSIG) input. This TSIG signal is typically a product of the laser local oscillator (LO) and the transmitter laser and is, therefore, essentially a replica of the transmitter signal heterodyned to the first Intermediate Frequency (IF) of the system. Also, the frequency bandwidth rejection characteristics of the CVM filter are not readily changed, nor may it be practical to provide for a frequency bandwidth rejection characteristic that rejects multiple frequency bandwidths.

It is therefore one object of the invention to provide a chirped backscatter filter which has a large bandwidth for rejecting rapidly time-varying frequency shifts caused by optical scanning devices in the signal path.

It is another object of the invention to provide a chirped backscatter filter which has a dynamic range in excess of 30-40 dB.

It is another object of the invention to provide a chirped backscatter filter which has passive, as opposed to active, characteristics thereby rendering the filter less sensitive to level variations in the TSIG input signal.

It is a still further object of the invention to provide a chirped backscatter filter which has easily varied filter rejection bandwidth characteristics.

It is one still further object of the invention to provide a chirped backscatter filter which has, if desired, filter rejection bandwidth characteristics for rejecting a plurality of different frequency bandwidths.

SUMMARY OF THE INVENTION

The foregoing problems are overcome and the above enumerated objects are realized by a chirped backscatter filter which, in accordance with the method and apparatus of the invention, comprises a frequency filter for removing an undesired frequency component, associated with transmitter backscatter radiation, from a received signal having a desired frequency component associated with a target. The filter comprises means for adding a first offset frequency to a received signal for generating a received signal intermediate frequency, the received signal having at least one desired frequency component and an undesired frequency component, and means for adding a second offset frequency to a reference signal for generating a reference signal intermediate frequency, the reference signal having a frequency component substantially equal to the undesired frequency component. The first offset frequency differs from the second offset frequency by a predetermined frequency, $f_n$. The filter also comprises means for subtracting the received signal intermediate frequency from the reference signal intermediate frequency to generate a first difference frequency signal having, for the undesired frequency component of the received signal which substantially equals the frequency component of the reference frequency, a frequency component substantially equal to the predetermined frequency component. The filter also comprises means for removing the predetermined frequency component from the first difference frequency signal to generate a filtered received signal wherein the undesired frequency component is substantially eliminated.

The received signal has a given modulation phase relationship with the reference, or transmitted, signal. This phase relationship is lost during the removal of the the backscatter frequency component. Thus, the filter of the invention further comprises means for subtracting a third offset frequency from the reference signal intermediate frequency to produce a second difference frequency and means for adding the second difference frequency to the filtered received signal to generate a received output signal having a modulation phase relationship with the reference frequency which is substantially equal to the given modulation phase relationship of the received signal with the reference signal.

BRIEF DESCRIPTION OF THE DRAWING

The foregoing features of the invention will be more fully described hereinafter in the Detailed Description of the Invention read in conjunction with the accompanying Drawing wherein:

FIG. 1 shows in block diagram form the major components of the chirped backscatter filter of the invention;

DETAILED DESCRIPTION OF THE INVENTION

Figure 3:
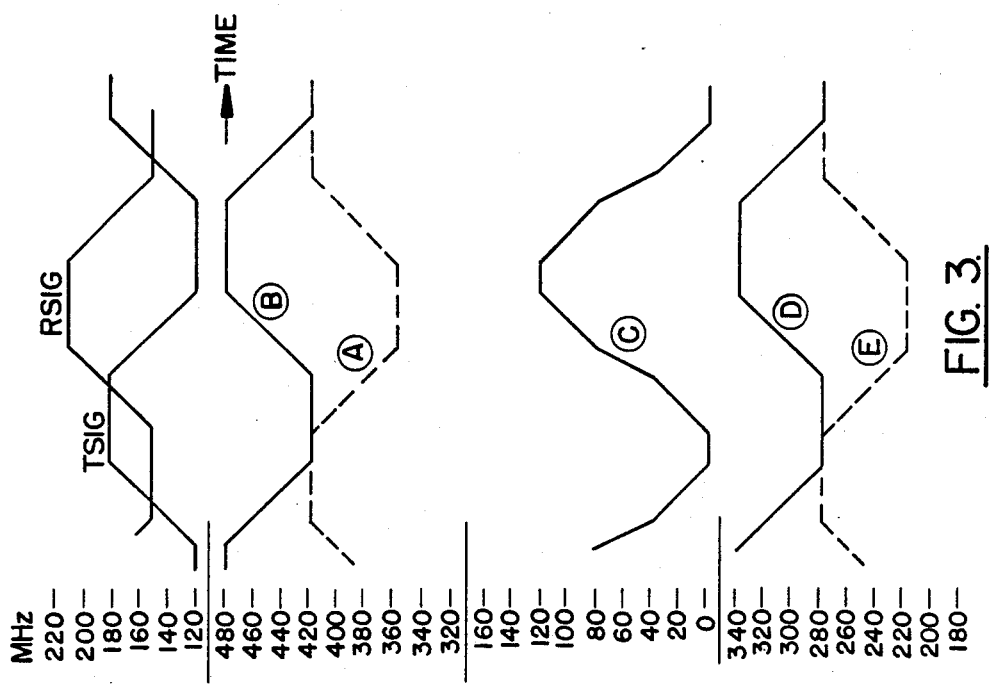
FIG. 3 shows in graphical form a plurality of time domain modulation (chirp) waveforms made possible by the filter of FIG. 1.

Referring to FIG. 1 there is shown, in block diagram form, a chirped backscatter filter 10 which is one embodiment of the invention. Filter 10 can be seen to comprise six frequency mixers (MIXER-A through MIXER-F), three bandpass filters, a frequency splitter and a notch filter. Six input signals are shown on the leftmost portion of FIG. 1 and two output signals on the rightmost portion. In order to facilitate an understanding of the ensuing description of the invention these signals are defined as follows.

RSIG is generated by a receiver detector, or first mixer, and is the product of a laser local oscillator (LO) and the return signals reflected from a target. RSIG has two major frequency components, namely a frequency component related to the desired target return signal and a frequency component related to the undesired transmitter backscatter. This backscatter can, in general, be reduced but not eliminated by the optical system associated with the receiver. The target and backscatter frequency components are different due to the aforedescribed Doppler frequency shift effects arising from rapidly scanned optical components and also to path length differences experienced by the two frequency components. In the embodiment disclosed herein RSIG is a frequency in the range of 120–180 MHz.

TSIG is a reference signal generated by a laser detector (mixer) and is the product of the laser LO and the transmitter laser. As was previously described, TSIG is substantially a replica of the transmitter signal heterodyned to the first Intermediate Frequency (IF) of the laser radar system. Both TSIG and RSIG are frequency modulated by a waveform similar to that illustrated at the top of FIG. 3. In the embodiment disclosed herein TSIG is a frequency in the range of 120–180 MHz.

LO2A and LO2B are, in accordance with the invention, auxiliary frequencies utilized to heterodyne RSIG and TSIG, respectively, to first IF signals having minimized undesirable frequency mixing components. Both LO2A and LO2B are offset from one another by an amount substantially equal to the center frequency $f_n$ of the circuit notch filter, which will be described in detail hereinafter. Frequency tuning of the radar receiver, to compensate for velocity induced Doppler shifts, may be accomplished by varying LO2A and LO2B in tandem with one another. Such frequency tuning may be desirable if the laser radar system is coupled to a moving platform. In this embodiment of the invention the notch filter has a center frequency of 60 MHz, LO2A is a frequency in the range of 540–570 MHz and LO2B is a frequency offset from LO2A by 60 MHz and is in the range of 600–630 MHz.

LO3 and LO4 are fixed frequencies which provide for heterodyning the first IF output signals to the second IF of the laser radar receiving system. In this embodiment of the invention LO3 is a frequency of 140 MHz at −10 dBm and LO4 is a frequency of 200 MHz at −10 dBm.

OUTA is an output signal to an "A" trigger video processor.

OUTS is an output signal to a receiver signal processor.

A primary function of the chirped backscatter filter 10 of FIG. 1 is to compare RSIG to TSIG and remove from RSIG the frequency component which is equal to TSIG in frequency. This removed frequency component corresponds to the frequency of the transmitter backscatter radiation. If TSIG were merely subtracted from RSIG and all difference frequencies but the null frequency component passed undesirable results would occur in that the difference frequencies would be both positive and negative. Thus the null frequency component would be difficult or impossible to accurately identify and reject. The invention overcomes this particular problem by adding a frequency offset ($f_n$) to both RSIG and TSIG before subtracting one from the other. Thus, equal frequency components in both RSIG and TSIG, such as the backscatter radiation frequency component of RSIG, will equal $f_n$. The frequencies resulting from this subtraction are thereafter passed through the notch filter which is centered on $f_n$ and which passes all frequency components except $f_n$. The output of the notch filter has substantially no frequency components associated with the backscatter frequency component. However, the RSIG phase reference is lost since the phase reference between the RSIG and TSIG modulation envelopes is destroyed during the backscatter filtering process. The invention overcomes this particular problem by adding TSIG to the filtered difference frequency component, thereby reestablishing the phase relationship of the original RSIG frequency components minus the backscatter frequency component.

MIXER-A 12 and MIXER-D 14 frequency shift RSIG and TSIG, respectively, to higher intermediate frequencies related to the values of LO2A and LO2B, respectively. It will be remembered that LO2A and LO2B are offset one from the other in frequency by an amount equal to $f_n$ (60 MHz), thus RSIG and TSIG are also offset one from the other by an amount equal to $f_n$. The frequency shifted RSIG is labeled as "A" in FIG. 1 and the frequency shifted TSIG is labeled as "B". The relationship of these frequency shifted signals is illustrated in the frequency conversion sequence graphically illustrated in FIG. 2. The intermediate frequencies A and B are each bandpass filtered to remove undesired mixing products by bandpass filters 16 and 18, respectively. Signal B is thereafter passed through a splitter 20 and is routed from one output of the splitter 20 to MIXER-B 22. Bandpass filtered signals A and B are thereafter subtracted one from the other by the MIXER-B 22 to yield a difference frequency "C". The time varying frequency characteristics of these signals is illustrated graphically in FIG. 3.

It can be appreciated that any frequency components of RSIG and TSIG which are substantially equal, such as the frequency component due to the backscattered transmitter radiation which is detected by the receiver, will equal the offset frequency between LO2A and LO2B, or 60 MHz. This is because those frequency components of RSIG and TSIG which are equal are frequency shifted one from the other by an amount equal to the offset between LO2A and LO2B. When the signals A and B are subtracted by MIXER-B 22 any 60 MHz component within the result corresponds to that portion of RSIG which comprises the transmitter backscatter radiation frequency.

Signal C is applied to the notch filter 24, centered at $f_n$ (60 MHz), where that frequency component of RSIG corresponding to the backscattered radiation is rejected. As was previously described, notch filter 24 is centered on 60 MHz, the amount of frequency offset applied to RSIG and TSIG by LO2A and LO2B, respectively, by MIXER-A 12 and MIXER-D 14, respectively.

Figure 2:
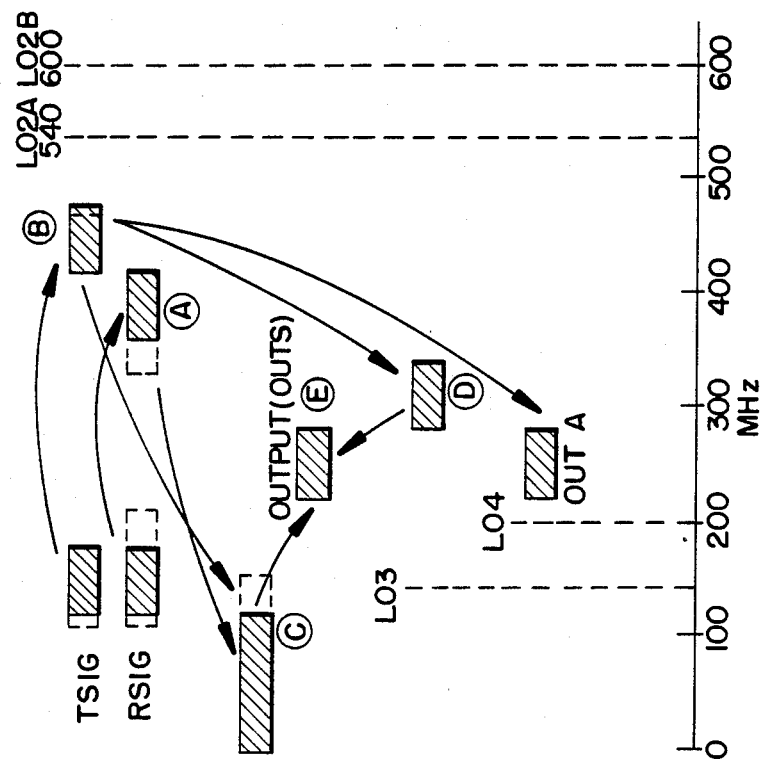
FIG. 2 shows in graphical form the frequency conversion sequence employed by the filter of FIG. 1.

In order to recover the phase modulation reference of RSIG bandpass filtered signal B is applied from another output of splitter 20 to the MIXER-E 26, where the constant frequency 140 MHz signal LO3 is subtracted therefrom. The output of MIXER-E 26 is filtered by bandpass filter 28 to remove undesired mixing products and is applied as a signal D to MIXER-C 30. MIXER-C 30 adds the frequencies of notch filtered signal C and the signal D to regain the original modulation phase of RSIG. The output of MIXER-C 30 is the received output signal OUTS, or "E", which is thereafter applied to the receiver signal processor (not shown) where desired target signal return processing is performed. The relationships of signals A-E in both the frequency and time domains are shown in FIG. 2 and FIG. 3, respectively.

A third output of splitter 20 applies bandpass filtered signal B to the MIXER-F 32 which, in conjunction with LO4, performs a frequency translation to TSIG to derive the signal OUTA. This frequency translation is generally unrelated to the backscatter frequency component rejection process described above.

Figure 4:
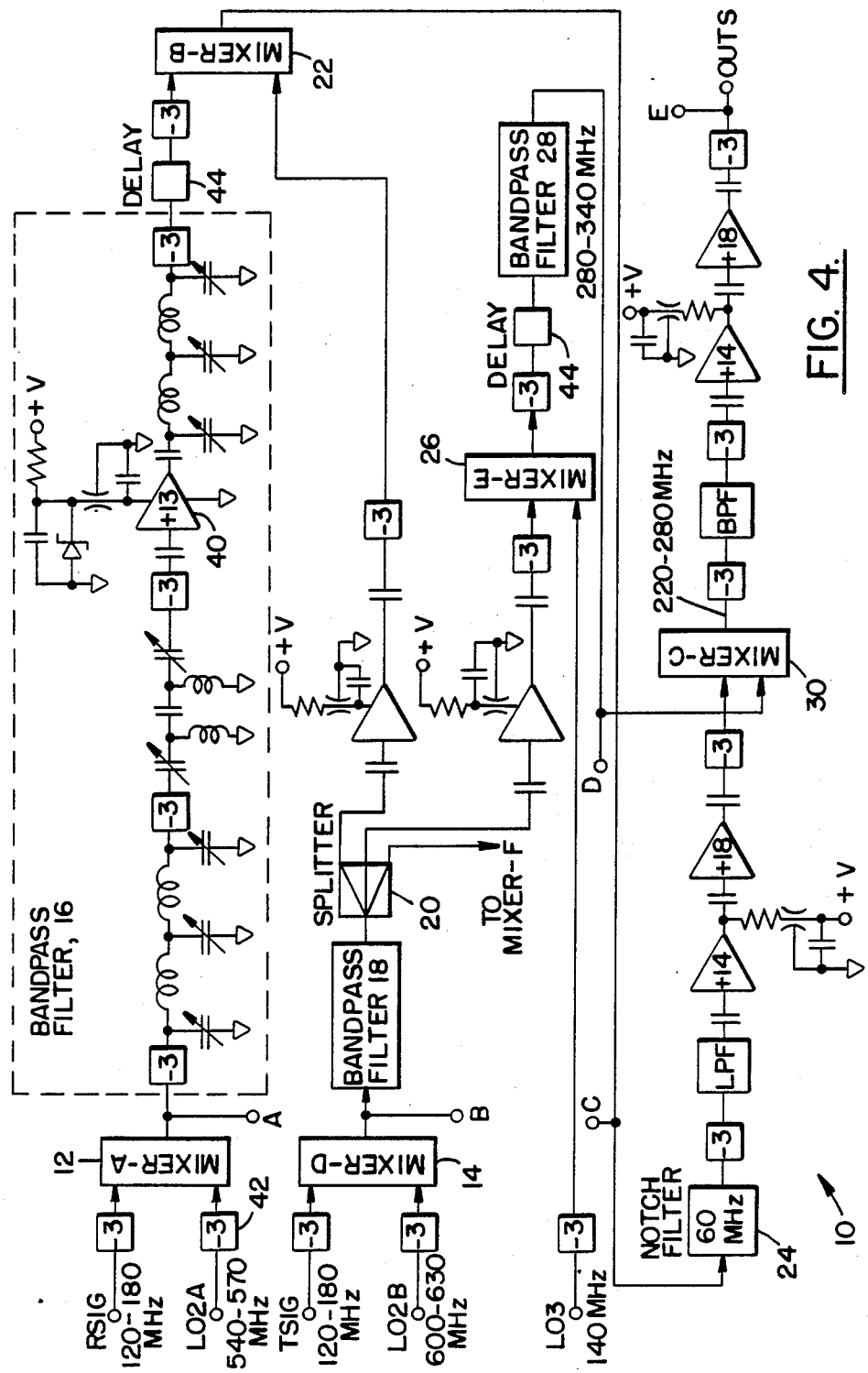
FIG. 4 illustrates a simplified schematic diagram which implements the block diagram of FIG. 1.

Referring to FIG. 4 there can be seen in more detail the circuity embodied in the block diagram of FIG. 1. Bandpass filter 16 can be seen to be comprised of a plurality of passive components and an active gain block 40 which provides 18 dB of gain to the signal. It should be realized that bandpass filters 18 and 28 comprise similar active and passive components, the design of such bandpass filters being well understood by those having skill in this art. Similarly, the other active and passive components which are illustrated in FIG. 4 have well understood functions, such as the $-3$ dB attenuators 42 and the delay elements 44, which may comprise well-known coaxial delay elements. The circuity for deriving the OUTA signal, which is coupled to the third output of splitter 20, is not shown in FIG. 4 in that this circuitry is not germane to an understanding of the method and apparatus of the invention.

It can be appreciated that the use of the invention overcomes the before enumerated problems of previous backscatter filters in that there are no control loops within the filter 10 which may induce a susceptibility to variations in the TSIG reference signal. Also, the dynamic range of the chirp backscatter filter has been found to be in excess of 50 dB, and the bandwidth has also been found to exceed that of previous filters. Furthermore, it can be appreciated that the filtering characteristics may be readily changed by changing the center frequency of the notch filter 24 in conjunction with the offset between LO2A and LO2B or that the filter 10 may be may be provided with a plurality of notch filters connected in parallel, each having a desired center frequency.

It can be further appreciated that the chirped backscatter filter disclosed herein may be adapted for use with other than laser radar systems and that a number of modifications may be made to the filter, such as providing inputs of different frequencies, without departing from the spirit and scope of the invention. Thus, the invention is not meant to be limited to the embodiment disclosed herein but is instead to be understood to be defined within the language and breadth of the appended claims.

What is claimed is:

1. A frequency filter for removing an undesired frequency component from a received signal having a desired frequency component, comprising:
   means for adding a first offset frequency to a received signal for generating a received signal intermediate frequency, said received signal having at least one desired frequency component and an undesired frequency component of known frequency;
   means for adding a second offset frequency to a reference signal for generating a reference signal intermediate frequency, said reference signal having a frequency component substantially equal to said undesired frequency component, said first offset frequency differing from said second offset frequency by a predetermined frequency such that a frequency component of said received signal intermediate signal that is associated with said undesired frequency component differs from said frequency component of said reference signal intermediate signal by an amount substantially equal to said predetermined frequency;
   means for subtracting said received signal intermediate frequency from said reference signal intermediate frequency to generate a first difference frequency signal having a frequency component substantially equal to said predetermined frequency; and
   means for removing from said first difference frequency signal said frequency component having said predetermined frequency to generate a filtered received signal wherein the undesired frequency component is substantially eliminated.

2. A frequency filter as defined in claim 1 wherein said received signal has a given modulation phase relationship with said reference signal, and further comprising:
   means for subtracting a third offset frequency from said reference signal intermediate frequency to produce a second difference frequency; and
   means for adding said second difference frequency to said filtered received signal to generate a received output signal having a modulation phase relationship with said reference frequency which is substantially equal to said given modulation phase relationship of said received signal with said reference signal.

3. A frequency filter as defined in claim 2 wherein said means for removing is a notch filter having a center frequency substantially equal to said predetermined frequency.

4. A frequency filter as defined in claim 3 wherein said means for adding a first offset frequency, said means for adding a second offset frequency and said means for subtracting each further comprise:
   means for eliminating unwanted frequency components generated by the operation of said means.

5. A frequency filter as defined in claim 3 wherein said predetermined frequency is substantially equal to 60 MHz.

6. A frequency filter as defined in claim 5 wherein said received signal and said reference signal vary between approximately 120 and 180 MHz, wherein said first offset frequency varies between approximately 540 and 570 MHz, wherein said second offset frequency varies between approximately 600 and 630 MHz and wherein said third offset frequency is substantially equal to 140 MHz.

7. A method of removing an undesired frequency component from a received signal having a desired frequency component, comprising the steps of:
 adding a first offset frequency to a received signal for generating a received signal intermediate frequency, the received signal having at least one desired frequency component and an undesired frequency component of known frequency;
 adding a second offset frequency to a reference signal for generating a reference signal intermediate frequency, the reference signal having a frequency component substantially equal to the undesired frequency component, the first offset frequency differing from the second offset frequency by a predetermined frequency such that a frequency component of the received signal intermediate signal that is associated with the undesired frequency component differs from the frequency component of the reference signal intermediate signal by an amount substantially equal to the predetermined frequency;
 subtracting the received signal intermediate frequency from the reference signal intermediate frequency to generate a first difference frequency signal having a frequency component substantially equal to said predetermined frequency,; and
 removing from the first difference frequency signal the frequency component having the predetermined frequency to generate a filtered received signal wherein the undesired frequency component is substantially eliminated.

8. A method as defined in claim 7 wherein the received signal has a given modulation phase relationship with the reference signal, and further comprising the steps of:
 subtracting a third offset frequency from the reference signal intermediate frequency to produce a second difference frequency; and
 adding the second difference frequency to the filtered received signal to generate a received output signal having a modulation phase relationship with the reference frequency which is substantially equal to the given modulation phase relationship of the received signal with the reference signal.

9. A method as defined in claim 8 wherein the step of removing is accomplished by a notch filter having a center frequency substantially equal to the predetermined frequency.

10. A method as defined in claim 8 wherein the steps of adding a first offset frequency, adding a second offset frequency and subtracting each further comprise a step of:
 eliminating unwanted frequency components generated during the performance step.

11. A method as defined in claim 9 wherein the predetermined frequency is substantially equal to 60 MHz.

12. A method as defined in claim 11 wherein the received signal and the reference signal vary between approximately 120 and 180 MHz, wherein the first offset frequency varies between approximately 540 and 570 MHz, wherein the second offset frequency varies between approximately 600 and 630 MHz and wherein the third offset frequency is substantially equal to 140 MHz.

13. A chirped backscatter filter for removing an undesired transmitter backscatter frequency component from a received signal having a desired target frequency component, comprising:
 a first frequency mixer for adding a first local oscillator frequency to a received signal for generating a received signal intermediate frequency, said received signal having at least one desired frequency component related to a target and an undesired frequency component related to backscatter radiation of known frequency from a transmitter;
 a second frequency mixer for adding a second local oscillator frequency to a reference signal for generating a reference signal intermediate frequency, said reference signal having a frequency component substantially equal to said undesired frequency component, said first local oscillator frequency differing from said second local oscillator frequency by a predetermined frequency such that a frequency component of said received signal intermediate signal that is associated with said undesired frequency component differs from said frequency component of said reference signal intermediate signal by an amount substantially equal to said predetermined frequency;
 a third frequency mixer for subtracting said received signal intermediate frequency from said reference signal intermediate frequency to generate a first difference frequency signal having a frequency component substantially equal to said predetermined frequency,; and
 a notch filter for removing from said first difference frequency signal said frequency component having said predetermined frequency to generate a filtered received signal wherein the undesired frequency component related to said backscattered transmitter radiation is substantially eliminated.

14. A chirped backscatter filter as defined in claim 13 wherein said received signal has a given modulation phase relationship with said reference signal, said reference frequency being related to a modulated transmitted signal, and further comprising:
 a fourth frequency mixer for subtracting a third local oscillator frequency from said reference signal intermediate frequency to produce a second difference frequency; and
 a fifth frequency mixer for adding said second difference frequency to said filtered received signal to generate a received output signal having a modulation phase relationship with said reference frequency which is substantially equal to said given modulation phase relationship of said received signal with said reference signal.

15. A chirped backscatter filter as defined in claim 14 wherein said notch filter has a center frequency substantially equal to said predetermined frequency.

16. A chirped backscatter filter as defined in claim 15 wherein said first frequency mixer, said second frequency mixer and said third frequency mixer each have an output operably coupled to a respective bandpass filter each of which is operable for passing therethrough only desired frequency components and for rejecting unwanted frequency components generated by the operation of said first, said second and said third frequency mixers.

17. A chirped backscatter filter as defined in claim 15 wherein said predetermined frequency is substantially equal to 60 MHz.

18. A chirped backscatter filter as defined in claim 17 wherein said received signal and said reference signal vary between approximately 120 and 180 MHz, wherein said first local oscillator frequency varies between approximately 540 and 570 MHz, wherein said second local oscillator frequency varies between approximately 600 and 630 MHz and wherein said third local oscillator frequency is substantially equal to 140 MHz.

19. A chirped backscatter filter as defined in claim 18 wherein said first and said second local oscillator frequencies are varied in tandem for compensating for Doppler effect related frequency shifts in said transmitted and said received signals.

* * * * *